US012566094B2

(12) United States Patent
Wen et al.

(10) Patent No.: US 12,566,094 B2
(45) Date of Patent: Mar. 3, 2026

(54) DEVICE FOR MEASURING PHYSICAL PROPERTY OF WAFER

(71) Applicant: FOXSEMICON INTEGRATED TECHNOLOGY, INC., Miao-Li Hsien (TW)

(72) Inventors: Si-Yu Wen, Miaoli Hsien (TW); Chun-Kai Huang, Miaoli Hsien (TW); Chun-Chung Chen, Miaoli Hsien (TW)

(73) Assignee: FOXSEMICON INTEGRATED TECHNOLOGY, INC., Miao-Li Hsien (TW)

( * ) Notice: Subject to any disclaimer, the term of this patent is extended or adjusted under 35 U.S.C. 154(b) by 399 days.

(21) Appl. No.: 18/199,858

(22) Filed: May 19, 2023

(65) Prior Publication Data

US 2023/0375415 A1     Nov. 23, 2023

(30) Foreign Application Priority Data

May 19, 2022     (CN) .......................... 202210557164.9

(51) Int. Cl.
| | |
|---|---|
| *G01K 1/143* | (2021.01) |
| *H01L 21/67* | (2006.01) |
| *H01L 21/673* | (2006.01) |

(52) U.S. Cl.
CPC ........ *G01K 1/143* (2013.01); *H01L 21/67265* (2013.01); *H01L 21/673* (2013.01); *H01L 21/6735* (2013.01)

(58) Field of Classification Search
CPC . G01K 1/143; H01L 21/67265; H01L 21/673; H01L 21/6735
See application file for complete search history.

(56) References Cited

U.S. PATENT DOCUMENTS

| | | | | | |
|---|---|---|---|---|---|
| 2011/0316571 | A1* | 12/2011 | Kiyokawa | .......... | G01R 31/2893 324/750.16 |
| 2021/0151338 | A1* | 5/2021 | Chandrasekaran | .......................... | H01L 21/6773 |

FOREIGN PATENT DOCUMENTS

| | | | | | |
|---|---|---|---|---|---|
| CN | 112908909 | A | * | 6/2021 | ............. H01L 22/12 |
| JP | 2004047929 | A | * | 2/2004 | |
| JP | 2020191399 | A | * | 11/2020 | ......... G01R 31/2875 |
| KR | 20190063626 | A | * | 6/2019 | ....... H01L 21/67248 |

* cited by examiner

*Primary Examiner* — Jamel E Williams
(74) *Attorney, Agent, or Firm* — ScienBiziP, P.C.

(57) ABSTRACT

A device is provided. The device is arranged in a wafer box and is configured to simulate to measure physical properties of a surface of a wafer in the wafer box during an air filling and exchanging operation on the wafer box when the wafer box is closed. The device includes one or more simulating members and one or more sensors. Each simulating members is arranged in one receiving groove. The physical properties of a surface of each simulating member received in the one receiving groove matches with the physical properties of the surface of the wafer received in the one receiving groove. At least one of the one or more sensors is arranged on a corresponding simulating member, each sensor is configured to measure the physical properties of a surface of a corresponding simulating member. A related wafer box is also provided.

18 Claims, 9 Drawing Sheets

100

100

100

100

Value of relative humidity

Time/second

DEVICE FOR MEASURING PHYSICAL PROPERTY OF WAFER

FIELD

The subject matter herein generally relates to semiconductor processing technology, and particularly to a device for measuring physical property of wafers.

BACKGROUND

In a technology of semiconductor wafers of larger sizes, a Front Opening Unified Pod (hereinafter FOUP) can be commonly employed to store and transfer wafers. The FOUP needs to be sealed to protect the wafers from contaminants by preventing contaminants, such as dust, moisture, oxygen gas, and the like in the environment from entering into the FOUP, and from reacting with the wafers in the FOUP because such reactions may cause faulty circuits, such as a short circuit and an open circuit. A fabrication yield of the wafers can be further improved. However, no matter whether the FOUP is open or closed, distributions of physical properties in an interior flow field in the FOUP, such as humidity, are different. Yields of the wafers is difference in different positions in the FOUP. For example, the yield difference between the yield of the wafer arranged in a low position and the yield of the wafer arranged in a high position, or the yield difference between the yield of the wafer closed to a moving door of the FOUP and the yield of the wafer away from the moving door is larger. However, quantifiably measuring the difference is difficult.

SUMMARY

An embodiment of the present application provides a device for measuring physical property of wafers which is capable of simulate to measure a physical property of a surface of the wafer in the wafer box.

In a first aspect, an embodiment of the present application provides a device for measuring physical property of wafers. The device is arranged in a wafer box and is configured to simulate to measure one or more physical properties of one or more surfaces of the one or more wafers in the wafer box during an air filling and exchanging operation on the wafer box when the wafer box is closed. A number of receiving grooves are defined in different heights of wafer box and are spaced apart from each other. Each receiving groove is configured to receive one wafer. The device includes one or more simulating members and one or more sensors. Each simulating member is arranged in one receiving groove. One or more physical properties of a surface of each simulating member received in the one receiving groove are configured to matches with the one or more physical properties of the surface of the wafer received in the corresponding receiving groove. At least one of the one or more sensors is arranged on a corresponding simulating member, each sensor is configured to measure the one or more physical properties of a surface of the corresponding simulating member.

According to some embodiments of the present application, each sensor is a temperature and humidity sensor and each sensor measures a humidity of the surface of the corresponding simulating member.

According to some embodiments of the present application, each simulating member includes a main body and an installing member, the main body is received and held in the corresponding receiving groove, the installing member is arranged on a surface of the main body, and the at least one sensor is arranged on a surface of the installing member, the surface is a side of the installing member away from the main body.

According to some embodiments of the present application, a shape and a size of the main body are configured to match with a shape and a size of the wafer in the corresponding receiving groove.

According to some embodiments of the present application, the at least one sensor is protruded to a preset height from the surface of the installing member where the at least one sensor is arranged, where the surface of the installing member is the side of the installing member away from the main body.

According to some embodiments of the present application, each simulating member corresponds to a number of sensors, one sensor is arranged at a center position of the corresponding simulating member, and the other sensors are arranged along an edge of the corresponding simulating member at a preset interval.

According to some embodiments of the present application, the device further includes one or more control units, one or more wireless transmitters, and one or more storage units. Each control unit is electrically coupled to a corresponding wireless transmitter and a corresponding storage unit. Each wireless transmitter is configured to transmit a signal to a wireless receiver external to the wafer box. Each control unit is configured to transmit a first control signal to the at least one sensor and control the at least one sensor to detect the one or more physical properties of the surface of the corresponding simulating member, and is configured to transmit a second control signal to the corresponding wireless transmitter and control the corresponding wireless transmitter to transmit a signal representing one or more values of the one or more physical properties of the surface of the corresponding simulating member sensed by the at least one sensor to the wireless receiver.

According to some embodiments of the present application, each control unit, the corresponding wireless transmitter, and the corresponding storage unit are all accommodated in the corresponding installing member.

According to some embodiments of the present application, the device further includes one or more switching units, each switching unit is coupled to a corresponding control unit, each switching unit is configured to be in a first state or in a second state. Wherein in the first state, each switching unit is configured to output a first signal to the corresponding control unit, and in the second state, each switching unit is configured to output a second signal to the corresponding control unit, each control unit is configured to control the at least one sensor to detect the one or more physical properties of the surface of the corresponding simulating member when the first signal is received, and is configured to control the at least one sensor to stop detecting the one or more physical properties of the surface of the corresponding simulating member when the second signal is received.

According to some embodiments of the present application, each simulating member is made of carbon fiber.

Comparing to a nowadays technology, the disclosure has the following beneficial effects:

In the disclosure, each simulating member loaded with at least one sensor is arranged into the wafer box, to simulate a real wafer and can be used to simulate to measure the one or more physical properties of the surface of the wafer in the wafer box.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

DETAILED DESCRIPTION

Implementations of the disclosure will now be described, by way of embodiments only, with reference to the drawings. The disclosure is illustrative only, and changes may be made in the detail within the principles of the present disclosure. It will therefore be appreciated that the embodiments may be modified within the scope of the claims.

In addition, it should be understood that in the description of this application, terms such as "first" and "second" are used only for distinguishing in the description, but are not intended to indicate or imply relative importance or an order. The terms "exemplary" and/or "example" are used herein to mean "serving as an example, instance, or illustration." Any embodiment described herein as "exemplary" and/or "example" is not necessarily to be construed as preferred or advantageous over other embodiments. A feature limited by "first", "second" may expressly or implicitly include one or more of the features. Use of the word "exemplary" is intended to present concepts and techniques in a concrete fashion. As used herein, the term "and/or," includes any and all combinations of one or more of the associated listed items.

It should be noted that the steps shown in the flowcharts can be performed by computer executable instructions in a computer system. In addition, although a logical sequence is shown in the flowcharts, in some circumstance, the shown or described steps may be performed in a sequence which is different from the sequence described herein.

Figure 1:
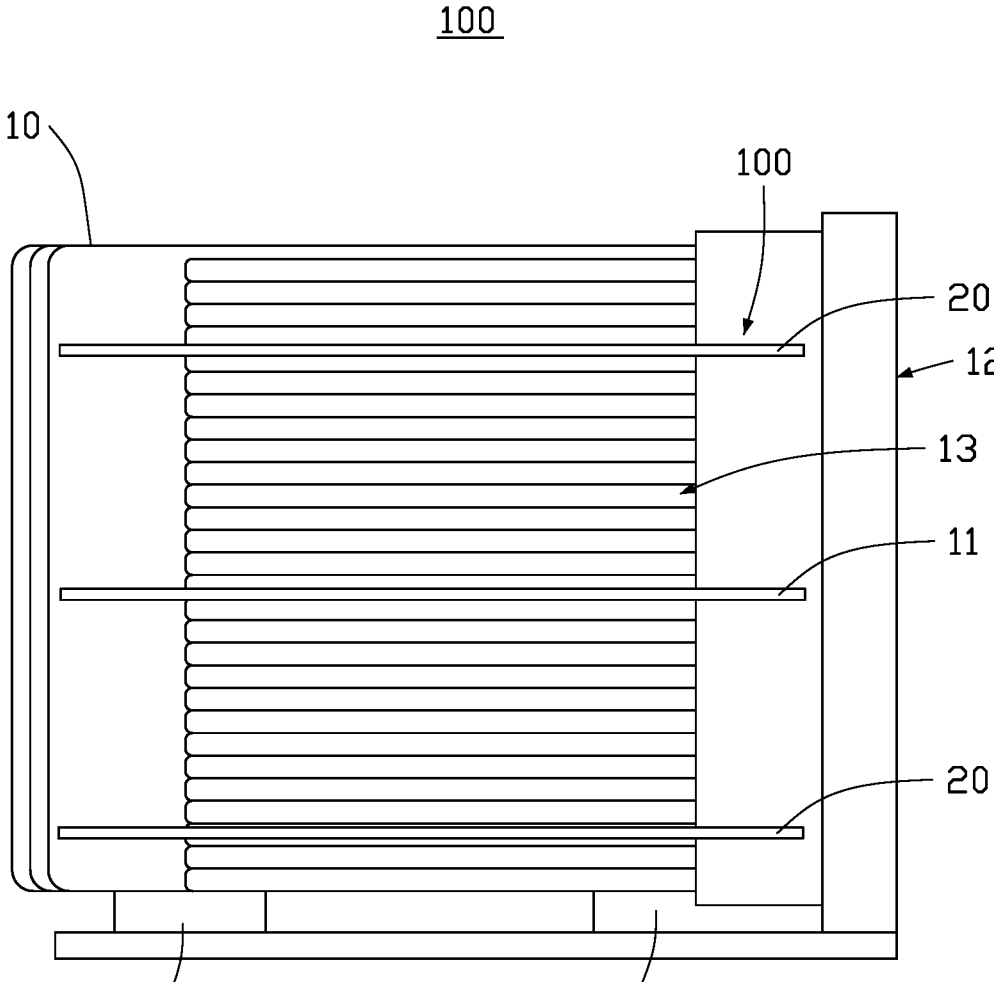
FIG. 1 is a side view of an embodiment of a device for measuring physical property of wafers, a wafer box, and other components.
Figure 2:
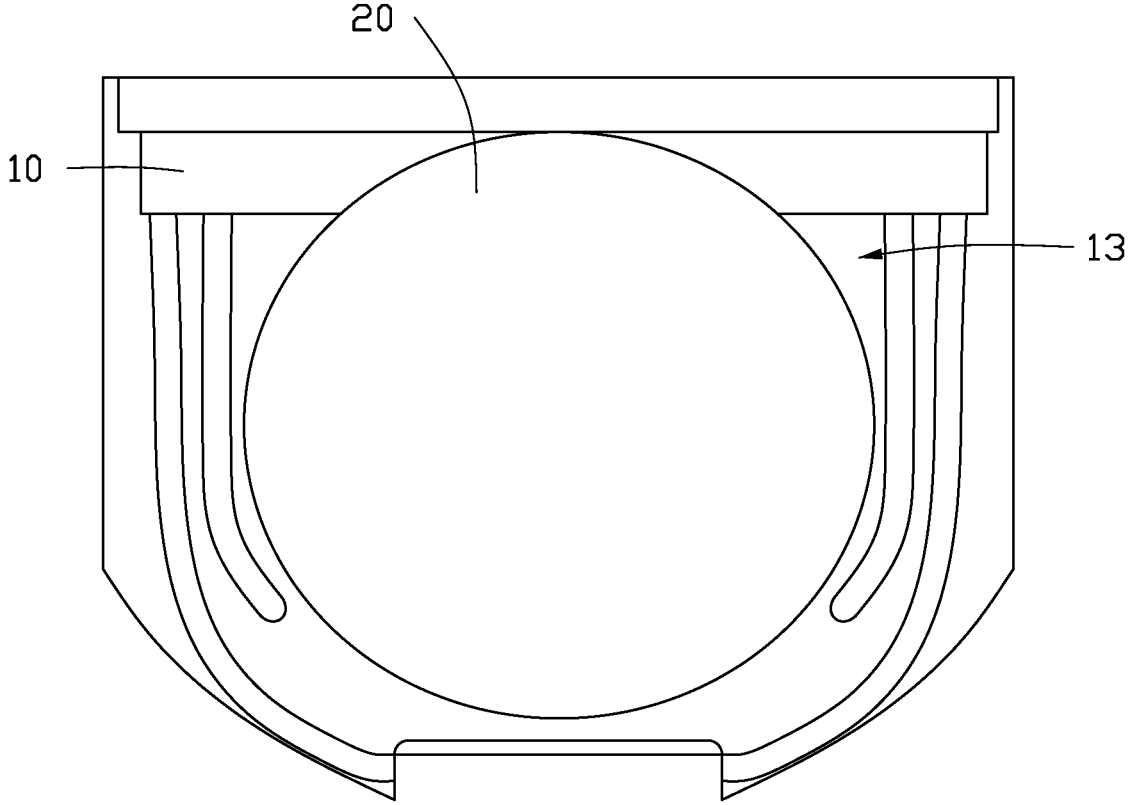
FIG. 2 is a top view of an embodiment of a device for measuring physical property of wafers and a wafer box, with a top of the wafer box removed.

Referring to FIGS. 1-2, a wafer box 10 includes a device for measuring physical property of wafers 100. The device for measuring physical property of wafers 100 is configured to simulate to measure one or more physical properties of one or more surfaces of the one or more wafers in the wafer box 10 during an air filling and exchanging operation on the wafer box 10 when the wafer box 10 is closed, for example simulate to measure a humidity of the air of the surface of the wafer. The device for measuring physical property of wafers 100 includes a simulating member 20 and at least one sensor 30 (see FIG. 3).

The wafer box 10 is configured to hold wafers 11 securely and safely in a controlled environment. The wafer box 10 defines an open 12. A movable door is arranged in the open 12. The movable door can be open by some devices or an operator. Thus, the wafer 11 (or the simulating member 20) held in the wafer box 10 can be taken out via the open 12, or the wafer 11 (or the simulating member 20) can be held in the wafer box 10 via the open 12. A number of receiving grooves 13 are defined in the wafer box 10. Each receiving groove 13 is configured to receive and hold one wafer 11 or one simulating member 20. In one embodiment, the receiving grooves 13 are stacked arranged in the wafer box 10. For example, the wafer box 10 of the embodiment defines twenty-five receiving grooves. The twenty-five receiving grooves 13 defined in the wafer box 10 are spaced apart from each other along a vertical direction of the wafer box 10. It can be understood that, the twenty-five receiving grooves 13 are arranged at different heights in the wafer box 10.

A bottom of the wafer box 10 further defines an inlet opening 14 and an outlet opening 15. The inlet opening 14 and the outlet opening 15 are respectively configured to cooperate with an air charging device and an air extracting device to exchange the air in the wafer box 10. For example, the air charging device can introduce the air into the wafer box 10 via the inlet opening 14, and the air extracting device can exhaust the air from the wafer box 10 via the outlet opening 15. Thus, the air charging device and the air extracting device can exchange the air in the wafer box 10, therefore the moisture and the oxygen in the wafer box 10 can be cleared up, and waiting time in a processing of the wafer 11 can be longer.

The simulating member 20 is configured to simulate the wafer 11 to be measured the one or more physical properties. The at least one sensor 30 is arranged on a surface of the simulating member 20, and is configured to measure the one or more physical properties of the surface of the simulating member 20, for example a humidity of the air of the surface of the simulating member 20. It can be understood that, the at least one sensor 30 is further configured to measure a temperature of the air of the surface of the simulating member 20, the disclosure is not limited herein.

In some embodiments, the simulating member 20 can be made of carbon fiber, thus a weight of the simulating member 20 is similar to a weight of the wafer 11. A size and a shape of the simulating member 20 is similar to a size and a shape of the wafer 11. In some embodiments, a shape of the simulating member 20 is a cycloid disk. It can be understood that, the simulating member 20 is similar to the wafer 11, thus the one or more physical properties of the surface of the simulating member 20 measured by the at least one sensor 30 can be considered as the one or more physical properties of the surface of the wafer 11 when the wafer box 10 loads the wafer 11. Namely, the one or more physical properties of the surface of the simulating member 20 and the one or more physical properties of the surface of the wafer 11 are the same.

It can be understood that, a number of simulating members 20 can be also employed to illustrate the disclosure. The simulating members 20 are respectively received in the receiving grooves 13 at different layers in the wafer box 10. Thus, the sensors 30 can measure the physical properties of the surfaces of the simulating members 20 at different heights inner the wafer box 10.

It can be understood that, the device for measuring physical property of wafers 100 can be used to simulate to measure the one or more physical properties of the surface of the wafer 11 in the wafer box 10 in a condition that the wafer box 10 is closed and the wafer box 10 is being filled and exchanged the air via the inlet opening 14 and the outlet opening 15. In the embodiment, to increase an accuracy of the measured data by one or more sensors 30, the receiving grooves 13 excluding the one or more receiving grooves 13 receiving the one or more simulating members 20 can receive the wafers 11, thus a change of the one or more physical properties is well simulated when the wafer box 10 loads the wafer 11.

In some embodiments, each sensor 30 is a temperature and humidity sensor and each sensor 30 is configured to measure a humidity of the surface of the corresponding simulating member 20. In some embodiments, each sensor 30 is further configured to measure a temperature of the surface of the corresponding simulating member 20.

Figure 3:
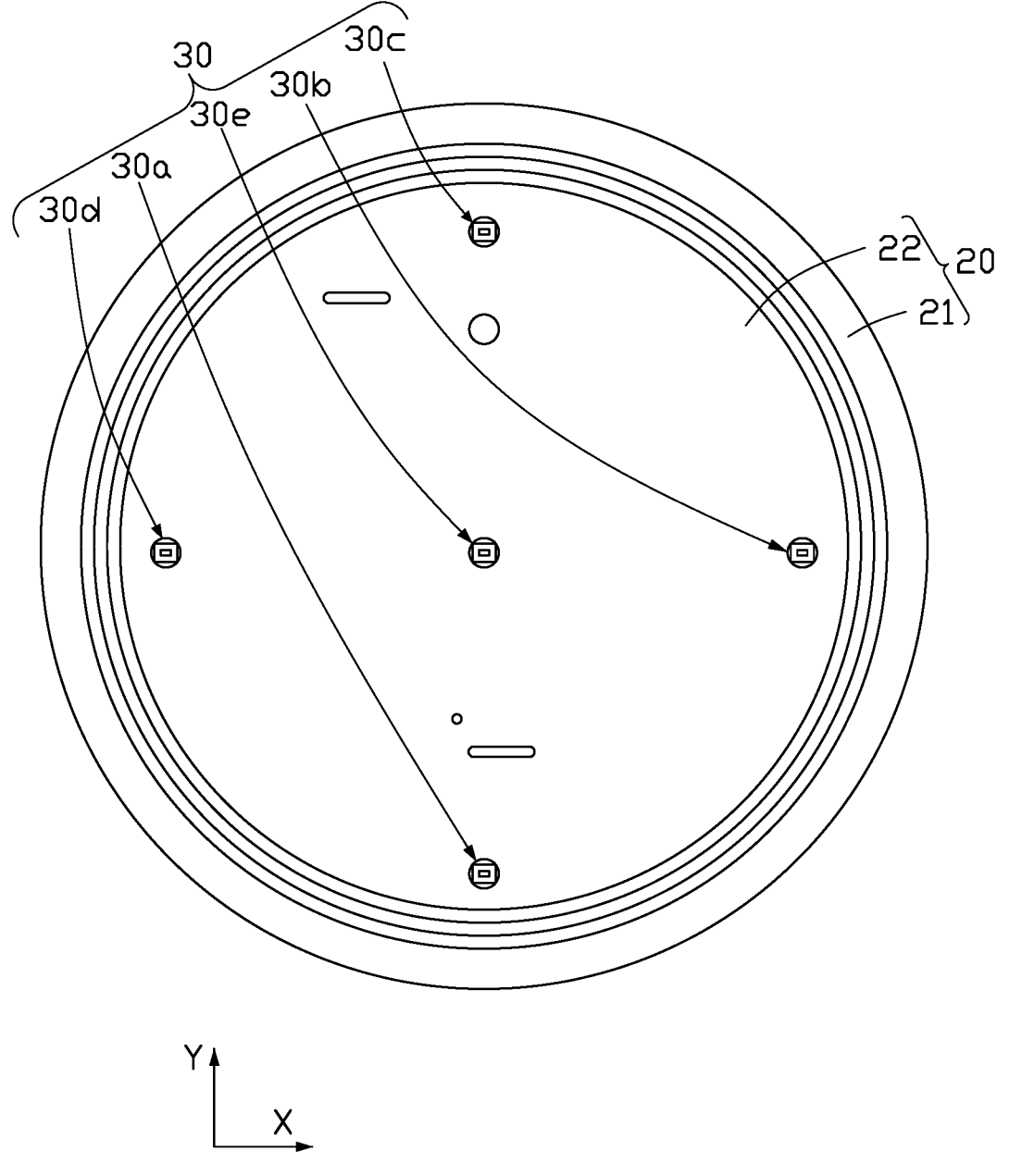
FIG. 3 is a top view of an embodiment of a simulating member and a number of sensors.

Referring also to FIG. 3, in some embodiments, there are a number of sensors 30 arranged on the surface of each simulating member 20, and the sensors 30 arranged on each simulating member 20 are arranged at different positions. For example, on each simulating member 20, one sensor 30 is arranged at a center position of the corresponding simulating member 20, and four sensors 30 are arranged along an edge of the corresponding simulating member 20 at a preset interval. For example, a sensor 30*e* is arranged at a center position of the corresponding simulating member 20, a sensor 30*a*, a sensor 30*b*, a sensor 30*d*, and a sensor 30*e* are arranged along an edge of the corresponding simulating member 20 at a preset interval. Thus, the sensors 30 can measure the one or more physical properties at different positions of the surface of the corresponding simulating member 20 at a horizontal direction. It can be understood that, the sensors 30 can be arranged at other positions of the surface of the corresponding simulating member 20.

Figure 4:
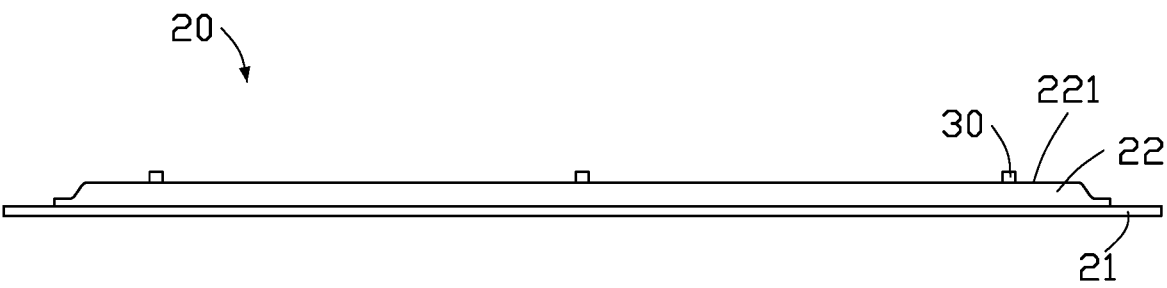
FIG. 4 is a schematic view of an embodiment of a simulating member and a number of sensors of the device for measuring physical property of wafers in the FIG. 1.

Referring also to FIG. 4, each simulating member 20 includes a main body 21 and an installing member 22. The installing member 22 is arranged on a surface of the main body 21. In some embodiments, cross sections of the main body 21 and the installing member 22 each is about a circular shape, and a radius of the main body 21 is greater than a radius of the installing member 22. A shape and a size of the main body 21 matches with a shape and a size of the wafer in the corresponding receiving groove, thus the main body 21 can be inserted into one receiving groove 13 of the wafer box 10. It can be understood that, a size and a shape of the main body 21 can be the same as a size and a shape of the real wafer 11. The installing member 22 is fixed stacked on the surface of the main body 21. In some embodiments, the installing member 22 is protruded from the surface of the main body 21. A surface of the installing member 22 which is a side away from the main body 21 is an installing surface 221. The installing surface 221 is configured to provide a place to arranged the at least one sensor 30. The at least one sensor 30 can be glued on the installing member 22. It can be understood that, the at least one sensor 30 can be attached on the installing member 22 via other manners, the disclosure is not limited herein. It can be understood that, the installing member 22 can be hollow to receive the components.

Figure 5:
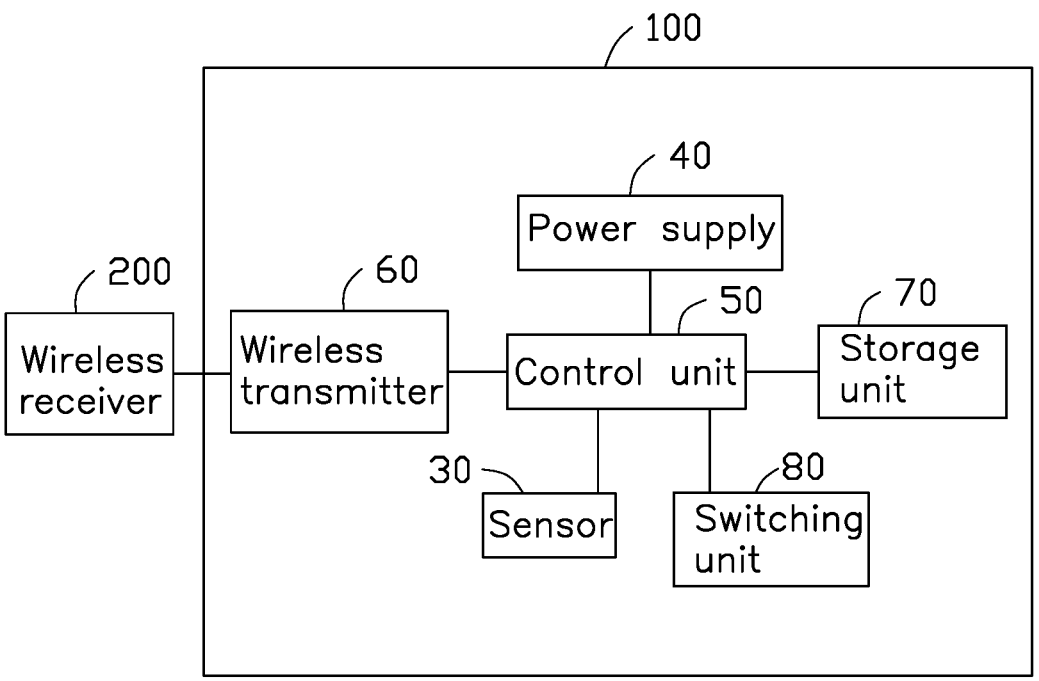
FIG. 5 is a block diagram of an embodiment of the device for measuring physical property of wafers in the FIG. 1.

Referring also to FIG. 5, the device for measuring physical property of wafers 100 further includes one or more power supplies 40, one or more control units 50, one or more wireless transmitters 60, one or more storage units 70, and one or more switching units 80. It can be understood that, one power supply 40, one control unit 50, one wireless transmitter 60, one storage unit 70, and one switching unit 80 are integrated into one simulating member 20, for example are arranged in the installing member 22 of the one simulating member 20 or are arranged on the surface of the one simulating member 20, namely, each simulating member 20 corresponds to one power supply 40, one control unit 50, one wireless transmitter 60, one storage unit 70, and one switching unit 80.

Each power supply 40 is configured to provide power for various corresponding components. Each power supply 40 can include a battery and a power supply control board. Each power supply control board is configured to control a charge of the corresponding battery, a discharge of the corresponding battery, a corresponding power consumption management, and the like. Each power supply 40 is electrically coupled to corresponding at least one sensor 30, a corresponding control unit 50, a corresponding wireless transmitter 60, a corresponding storage unit 70, and a corresponding switching unit 80. It can be understood that, components corresponding to one simulating member 20 can be powered by different power supplies, or all can be powered by one power supply, the disclosure is not limited herein.

Each wireless transmitter 60 is configured to transmit a signal to a wireless receiver 200 external to the wafer box 10, for example transmit a signal representing one or more values of the one or more physical properties in the wafer box 10 to the wireless receiver 200. An electronic device can show the one or more physical properties received by the wireless receiver 200, thus the user can view the one or more physical properties in the wafer box 10 anytime. The electronic device can be a personal computer, a tablet computer, a mobile phone, a PDA, or the like, and is not limited herein.

Each storage unit 70 may be configured to store computer program instruction and various data, for example be configured to store signals measured by the at least one sensor 30. Each storage unit 70 mainly includes a program storage area and a data storage area. Each program storage area may store an operating system, control program, and computer program instruction, such as a text editor. Each data storage area may store data created according to use of the device for measuring physical property of wafers 100, and the like. Each storage unit 70 can include high-speed random access memory and non-transitory storage medium, such as a disk storage device, a flash memory, or other transitory storage medium.

The control units 50 are a control center of the device for measuring physical property of wafers 100. Various parts of the device for measuring physical property of wafers 100 are electrically connected to the control units 50. The control units 50 process data by running or executing a software program and/or an instruction set stored in the storage units 70 and invoking data stored in the storage units 70, so as to perform overall control on the device for measuring physical property of wafers 100. Each control unit 50 is configured to transmit a first control signal to the corresponding at least one sensor 30 to control the corresponding at least one sensor 30 to detect an environment in the wafer box 10, for example detect the humidity in the wafer box 10. Each control unit 50 is further configured to transmit a second control signal to the corresponding wireless transmitter 60 to control the corresponding wireless transmitter 60 to transmit the signal representing one or more values of the environment in the wafer box 10 detected by the corresponding at least one sensor 30 to the wireless receiver 200, for example transmit the signal representing a value of the humidity in the wafer box 10, to the wireless receiver 200.

Each switching unit 80 is configured to control an on or an off of the corresponding at least one sensor 30. In detail, each switching unit 80 is configured to be in a first state or be in a second state. Wherein, in a first state (for example being closed), each switching unit 80 is configured to output a first signal to the corresponding control unit 50. Each control unit 50 is configured to control the corresponding at least one sensor 30 to detect the humidity of the surface of the corresponding simulating member 20 in the wafer box 10 when the first signal is received. Wherein, in a second state (for example being open), each switching unit 80 is configured to output a second signal to the corresponding control unit 50. Each control unit 50 is configured to control the corresponding at least one sensor 30 to stop detecting the humidity when the second signal is received. Thus, the at least one sensor 30 can be turned on in advance via the corresponding switching unit 80 when a physical property measurement is needed, and the at least one sensor 30 can be turned off via the corresponding switching unit 80 after measuring. In some embodiments, each switching unit 80 is arranged on the surface of the corresponding simulating member 20 to be conveniently turned on or turned off the corresponding at least one sensor 30. It can be understood that, each switching unit 80 turns on or turns off the corresponding at least one sensor 30 when being outside the wafer box 10, and the device for measuring physical property of wafers 100 including the one or more switching units 80 is placed into the wafer box 10 after turning on or turning off the corresponding at least one sensor 30.

It can be understood that, each power supply 40, the corresponding control unit 50, the corresponding wireless transmitter 60, and the corresponding storage unit 70 are arranged in the installing member 22 of the corresponding simulating member 20.

It can be understood that, the device for measuring physical property of wafers 100 can further store the value of the humidity of the surface of the one or more simulating members in the wafer box 10 detected by the one or more sensors 30 in the storage units 70. The device for measuring physical property of wafers 100 can further transmit the signal representing the value of the stored humidity of the surface of the one or more simulating members 20 in the wafer box 10 to an electronic device external to the wafer box 10 via the wireless receivers 200 or the other communication units of the device for measuring physical property of wafer 100.

Referring again to FIG. 4, in some embodiments, each sensor 30 is protruded to a preset height from the corresponding simulating member 20, for example from the installing surface of the corresponding simulating member 20. In some embodiments, the preset height is about 0-6 mm. Thus, a delay of detecting the humidity caused by a slow flow in the flow field in the wafer box 10 can be avoided.

It can be understood that, a cushion ply can be arranged between each sensor 30 and the corresponding installing surface to increase a height of the corresponding sensor 30 protruding from the corresponding simulating member 20, causing each sensor 30 to be protruded to a preset height from the corresponding simulating member 20.

Figure 6:
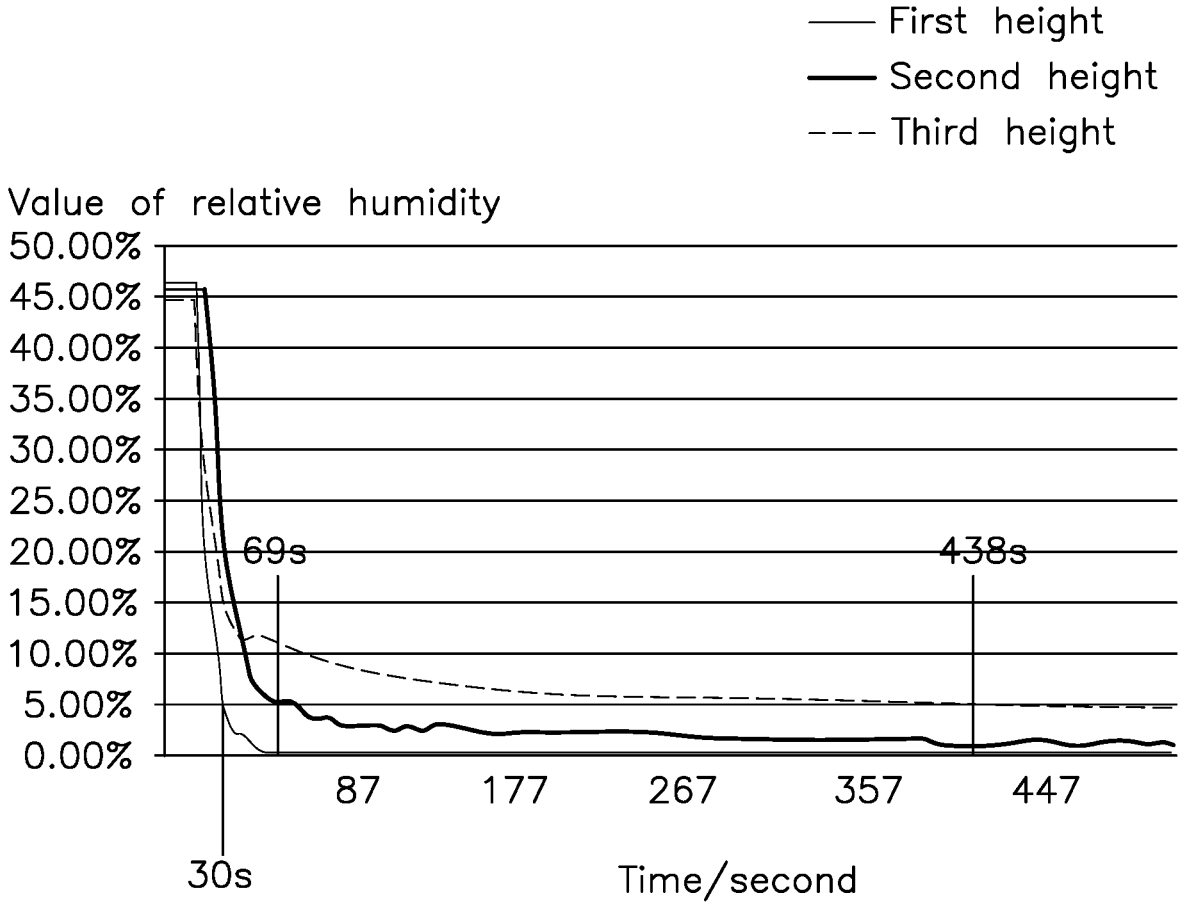
FIG. 6 is a curve diagram of an embodiment showing values of relative humidity detected by sensors arranged at different heights at various time points.

Referring to FIG. 6, a number of sensors (for example three sensors) on one simulating member can be arranged at a first height, a second height, and a third height. The heights are descended in turn from the first height, the second height, and the third height. The first height, the second height, and the third height each is a height that the corresponding sensor protrudes to from the one simulating member. When an initial value of relative humidity of the air in the wafer box is between 45% and 50%, suppose that an air pressure of the air is −1.5 kpa and a flow rate of the air is greater than or equal to 130 liter per minute, the value of the relative humidity of the air detected by the sensor at the first height is descended to 5% in 30 seconds, the value of the relative humidity of the air detected by the sensor at the second height is descended to 5% in 69 seconds, and the value of the relative humidity of the air detected by the sensor at the third height is descended to 5% in 438 seconds. Thus, a sensor whose height is higher can detect that the value of the relative humidity of the air is descended to 5% quicker, namely, the higher the sensor, the sensor is more sensitivity.

Figure 7:
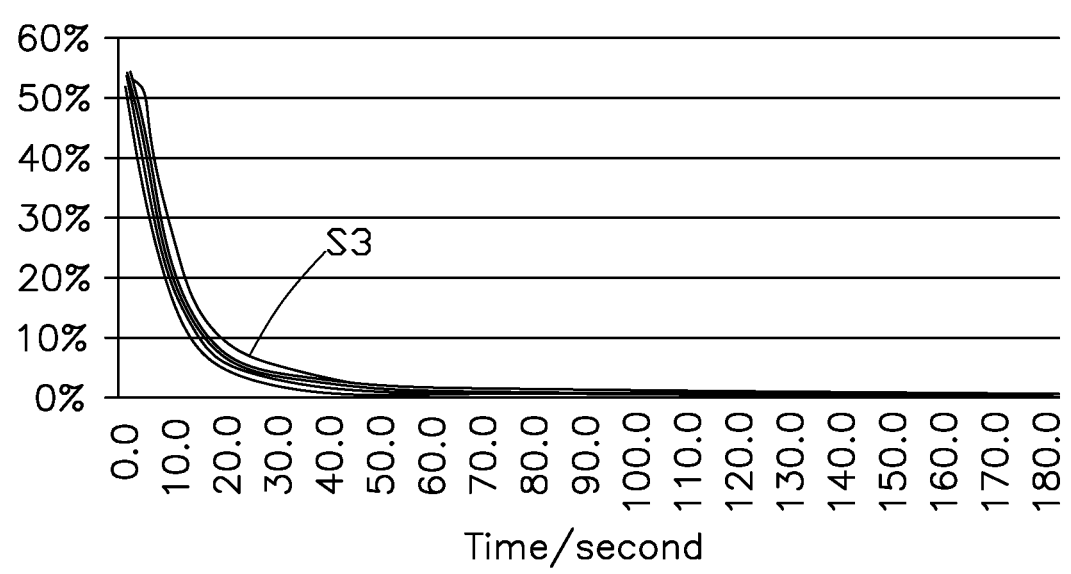
FIG. 7 is a curve diagram of an embodiment showing valves of relative humidity detected by sensors at various time points, where the sensors are arranged at a simulating member which is received in a receiving groove at a first layer.
Figure 8:
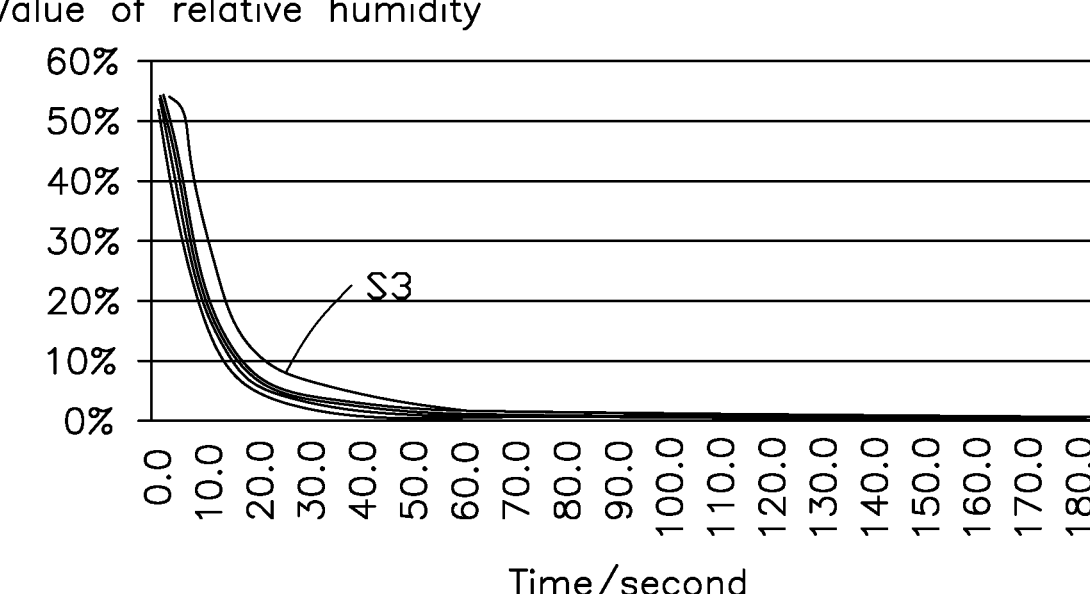
FIG. 8 is a curve diagram of an embodiment showing valves of relative humidity detected by sensors at various time points, where the sensors are arranged at a simulating member which is received in a receiving groove at a sixth layer.
Figure 9:
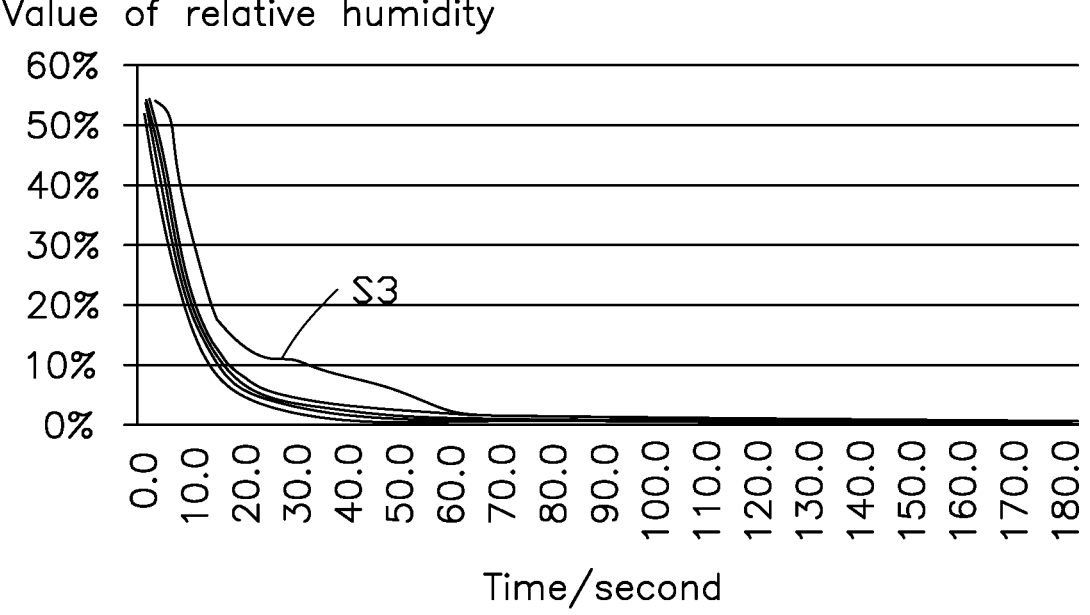
FIG. 9 is a curve diagram of an embodiment showing valves of relative humidity detected by sensors at various time point, where the sensors are arranged at a simulating member which is received in a receiving groove at a thirteenth layer.

Referring to FIGS. 7-9, there are a number of sensors, each sensor is the sensor at the first height in the FIG. 6 which detects that the value of the relative humidity of the air is descended to 5% in 30 seconds. The sensors measure the descending characteristics of the humidity of the air at different heights and at different positions in the wafer box. For example, three simulating members are respectively received in the receiving groove at a first layer of the wafer box, the receiving groove at a sixth layer of the wafer box, and the receiving groove at a thirteenth layer of the wafer box. The first layer of the wafer box is a lowest position in the wafer box. FIG. 7 shows valves of the relative humidity detected by the sensors at various time points, where the sensors are arranged at a simulating member which is received in a receiving groove at a first layer. FIG. 8 shows valves of the relative humidity detected by the sensors at various time points, where the sensors are arranged at the simulating member received in the receiving groove at the sixth layer of the wafer box. FIG. 9 shows valves of the relative humidity detected by the sensors at various time point, where the sensors are arranged at the simulating member received in the receiving groove at the thirteenth layer of the wafer box. According to the FIGS. 7-9, it is determined that the closer the sensors to a bottom of the wafer box, the quicker of the descent of the values of the relative humidity of the air with time is detected by the sensors.

In some embodiments, the sensors attached to each simulating member can be the sensor 30a, the sensor 30b, the sensor 30c, the sensor 30d, and the sensor 30e as shown in the FIG. 3. For each simulating member, the sensor 30a, the sensor 30b, the sensor 30c, the sensor 30d, and the sensor 30e represent the sensors on different positions of the corresponding simulating member. Where, the sensor 30c is arranged adjacent to the open of the wafer box, the sensor 30e is arranged at the center position of the corresponding simulating member. Each curve S3 in the FIGS. 7-9 is the curve showing the valves of the relative humidity detected by the sensor 30c at various time point. Thus, according to the FIGS. 7-9, it is determined that the closer the sensor to the open of the wafer box, the slower of the descent of the values of the relative humidity of the air with time is detected by the sensors.

In the disclosure, each simulating member loaded with at least one sensor is arranged into the wafer box, to simulate a real wafer and is used to simulate to measure the one or more physical properties of the surface of the wafer in the wafer box.

It should be emphasized that the above-described embodiments of the present disclosure, including any particular embodiments, are merely possible examples of implementations, set forth for a clear understanding of the principles of the disclosure. Many variations and modifications can be made to the above-described embodiment(s) of the disclosure without departing substantially from the spirit and principles of the disclosure. All such modifications and variations are intended to be included herein within the scope of this disclosure and protected by the following claims.

What is claimed is:

1. A device configured for simulating to measure one or more physical properties of one or more surfaces of one or more wafers in a wafer box during an air filling and exchanging operation on the wafer box when the wafer box is closed, a plurality of receiving grooves being defined in different heights of the wafer box and being spaced apart from each other, each of the plurality of the receiving grooves is configured to receive one wafer, wherein:

the device comprises one or more simulating members and one or more sensors, wherein:

each of the one or more simulating members is arranged in one of the plurality of the receiving grooves, a surface of each of the one or more simulating members which is received in the one of the plurality of the receiving grooves comprises the one or more physical properties which are configured to match with the one or more physical properties of one of the one or more surfaces of one of the one or more wafers received in a corresponding receiving groove, and at least one of the one or more sensors is arranged on a corresponding one of the one or more simulating members, each of the one or more sensors is configured to measure the one or more physical properties of a surface of the corresponding one of the one or more simulating members;

wherein:

each of the one or more simulating members comprises a main body and an installing member;

the main body is received and held in the corresponding receiving groove, the installing member is arranged on a surface of the main body, and the at least one sensor is arranged on a surface of the installing member, the surface is a side of the installing member away from the main body.

2. The device according to claim 1, wherein:

each of the one or more sensors is a temperature and humidity sensor, and each of the one or more sensors measures the humidity of the surface of the corresponding one of the one or more simulating members.

3. The device according to claim 1, wherein:

a shape and a size of the main body are configured to match with a shape and a size of the wafer in the corresponding receiving groove.

4. The device according to claim 1, wherein:

the at least one sensor is protruded to a preset height from the surface of the installing member where the at least one sensor is arranged, where the surface of the installing member is the side of the installing member away from the main body.

5. The device according to claim 1, wherein:

each of the one or more simulating members corresponding to a plurality of sensors, one of the plurality of sensors is arranged at a center position of the corresponding one of the one or more simulating members, and the other of the plurality of sensors are arranged along an edge of the corresponding one of the one or more simulating members at a preset interval.

6. The device according to claim 1, wherein:

the device further comprises one or more control units, one or more wireless transmitters, and one or more storage units, each of the one or more control units is electrically coupled to a corresponding one of the one or more wireless transmitters and a corresponding one of the one or more storage units;

each of the one or more wireless transmitters is configured to transmit a signal to a wireless receiver external to the wafer box;

each of the one or more control units is configured to transmit a first control signal to the at least one sensor and control the at least one sensor to detect the one or more physical properties of the surface of the corresponding one of the one or more simulating members, and each of the one or more control units is further configured to transmit a second control signal to the corresponding one of the one or more wireless transmitters and control the corresponding one of the one or more wireless transmitters to transmit a signal representing one or more values of the one or more physical properties of the surface of the corresponding one of the one or more simulating members sensed by the at least one sensor to the wireless receiver.

7. The device according to claim 6, wherein:

each of the one or more control units, the corresponding one of the one or more wireless transmitters, and the corresponding one of the one or more storage units are accommodated in the corresponding one of the one or more simulating members.

8. The device according to claim 6, wherein:

the device further comprises one or more switching units;

each of the one or more switching units is coupled to a corresponding one of the one or more control units, each of the one or more switching units is configured to be in a first state or in a second state, wherein in the first state, each of the one or more switching units is configured to output a first signal to the corresponding one of the one or more control units, and wherein in the second state, each of the one or more switching units is configured to output a second signal to the corresponding one of the one or more control units;

each of the one or more control units is configured to control the at least one sensor to detect the one or more physical properties of the surface of the corresponding one of the one or more simulating members when the first signal is received, and is configured to control the at least one sensor to stop detecting the one or more physical properties of the surface of the corresponding one of the one or more simulating members when the second signal is received.

9. The device according to claim 1, wherein:

each of the one or more simulating members is made of carbon fiber.

10. A wafer box comprising a device, the device being arranged inside a wafer box and being configured for simulating to measure one or more physical properties of one or more surfaces of one or more wafers in the wafer box during an air filling and exchanging operation on the wafer box when the wafer box is closed, a plurality of receiving grooves being defined in different heights of the wafer box and being spaced apart from each other, each of the plurality of the receiving grooves is configured to receive one wafer, wherein:

the device comprises one or more simulating members and one or more sensors;

each of the one or more simulating members is arranged in one of the plurality of the receiving grooves, a surface of each of the one or more simulating members which is received in the one of the plurality of the receiving grooves comprises the one or more physical properties which are configured to match with the one or more physical properties of one of the one or more surfaces of one of the one or more wafers received in a corresponding receiving groove; and at least one of the one or more sensors is arranged on a corresponding one of the one or more simulating members, each of the one or more sensors is configured to measure the one or more physical properties of a surface of the corresponding one of the one or more simulating members;

wherein:

each of the one or more simulating members comprises a main body and an installing member;

the main body is received and held in the corresponding receiving groove, the installing member is arranged on a surface of the main body, and the at least one sensor is arranged on a surface of the installing member, the surface is a side of the installing member away from the main body.

11. The wafer box according to claim 10, wherein:

each of the one or more sensors is a temperature and humidity sensor, and each of the one or more sensors measures the humidity of the surface of the corresponding one of the one or more simulating members.

12. The wafer box according to claim 10, wherein:

a shape and a size of the main body are configured to match with a shape and a size of the wafer in the corresponding receiving groove.

13. The wafer box according to claim 10, wherein:

the at least one sensor is protruded to a preset height from the surface of the installing member, where the surface of the installing member is the side of the installing member away from the main body.

14. The wafer box according to claim 10, wherein:

each of the one or more simulating members corresponding to a plurality of sensors, one of the plurality of sensors is arranged at a center position of the corresponding one of the one or more simulating members, and the other of the plurality of sensors are arranged along an edge of the corresponding one of the one or more simulating members at a preset interval.

15. The wafer box according to claim 10, wherein:

the device further comprises one or more control units, one or more wireless transmitters, and one or more storage units, each of the one or more control units is electrically coupled to a corresponding one of the one or more wireless transmitters and a corresponding one of the one or more storage units;

each of the one or more wireless transmitters is configured to transmit a signal to a wireless receiver external to the wafer box;

each of the one or more control units is configured to transmit a first control signal to the at least one sensor and control the at least one sensor to detect the one or more physical properties of the surface of the corresponding one of the one or more simulating members, and each of the one or more control units is further configured to transmit a second control signal to the corresponding one of the one or more wireless transmitters and control the corresponding one of the one or more wireless transmitters to transmit a signal representing one or more values of the one or more physical properties of the surface of the corresponding one of the one or more simulating members sensed by the at least one sensor to the wireless receiver.

16. The wafer box according to claim 15, wherein:

each of the one or more control units, the corresponding one of the one or more wireless transmitters, and the corresponding one of the one or more storage units are accommodated in the corresponding one of the one or more simulating member.

17. The wafer box according to claim 15, wherein:

the device further comprises one or more switching units;

each of the one or more switching units is coupled to a corresponding one of the one or more control units, each of the one or more switching units is configured to be in a first state or in a second state, wherein in a first state, each of the one or more switching units is configured to output a first signal to the corresponding one of the one or more control units, and wherein in the second state, each of the one or more switching units is configured to output a second signal to the corresponding one of the one or more control units, each of the one or more control units is configured to control the at least one sensor to detect the one or more physical properties of the surface of the corresponding one of the one or more simulating members when the first signal is received, and is configured to control the at least one sensor to stop detecting the one or more physical properties of the surface of the corresponding one of the one or more simulating members when the second signal is received.

18. The wafer box according to claim 10, wherein:

each of the one or more simulating members is made of carbon fiber.

\* \* \* \* \*